United States Patent
Hara et al.

(10) Patent No.: US 9,392,732 B2
(45) Date of Patent: Jul. 12, 2016

(54) ELECTRONIC CONTROL UNIT AND ROTATING ELECTRIC MACHINE

(71) Applicant: DENSO CORPORATION, Kariya, Aichi-pref. (JP)

(72) Inventors: Yoshimichi Hara, Kuwana (JP); Toshihisa Yamamoto, Anjo (JP); Takahiro Yamanaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 123 days.

(21) Appl. No.: 14/174,936

(22) Filed: Feb. 7, 2014

(65) Prior Publication Data

US 2014/0225482 A1    Aug. 14, 2014

(30) Foreign Application Priority Data

Feb. 12, 2013  (JP) .................................. 2013-24227

(51) Int. Cl.
| | |
|---|---|
| *H02K 11/00* | (2016.01) |
| *H02K 9/10* | (2006.01) |
| *H02K 5/22* | (2006.01) |
| *H05K 7/20* | (2006.01) |
| *H02K 9/22* | (2006.01) |

(52) U.S. Cl.
CPC .............. *H05K 7/20509* (2013.01); *H02K 5/22* (2013.01); *H02K 9/22* (2013.01); *H02K 11/33* (2016.01); *H05K 7/20854* (2013.01); *H01L 2224/48091* (2013.01); *H01L 2224/48247* (2013.01); *H01L 2224/49171* (2013.01); *H01L 2924/13091* (2013.01); *H01L 2924/181* (2013.01)

(58) Field of Classification Search
CPC ........ H02K 11/0073; H02K 9/22; H02K 5/22
USPC ................... 310/68 D, 64; 361/688, 704, 711
See application file for complete search history.

(56) References Cited

U.S. PATENT DOCUMENTS

| | | | | |
|---|---|---|---|---|
| 4,668,898 | A * | 5/1987 | Harms et al. | 318/400.21 |
| 5,737,191 | A * | 4/1998 | Horiuchi et al. | 361/764 |
| 6,577,030 | B2 * | 6/2003 | Tominaga et al. | 310/68 B |
| 7,019,395 | B2 * | 3/2006 | Hirano et al. | 257/717 |
| 7,310,225 | B2 * | 12/2007 | Ha | H01M 2/1061 361/688 |

(Continued)

FOREIGN PATENT DOCUMENTS

| | | |
|---|---|---|
| JP | 2002-261206 | 9/2002 |
| JP | 2007116840 A * | 5/2007 |
| JP | 2010-028925 | 2/2010 |
| JP | 2012-015372 | 1/2012 |
| JP | 2012-079741 | 4/2012 |

OTHER PUBLICATIONS

Machine Translation, OTA, JP 2012079741 A, Apr. 19, 2012.*

(Continued)

*Primary Examiner* — Thomas Truong
(74) *Attorney, Agent, or Firm* — Nixon & Vanderhye P.C.

(57) ABSTRACT

An electronic control unit is equipped with a semiconductor module having a semiconductor chip electrically connected to the first circuit pattern and the second circuit pattern. A resin body is wrapped around the semiconductor chip. A first metal plate has a side connected to the semiconductor chip and an other side connected to the first circuit pattern. A radiator projects toward and is connected to the first circuit pattern by a first heat conductor. As a result, heat generated by the semiconductor chip is transmitted to the radiator through the first metal plate, the first circuit pattern, and the first heat conductor during operation of the semiconductor module.

10 Claims, 7 Drawing Sheets

(56) References Cited

U.S. PATENT DOCUMENTS

2007/0205038 A1\* 9/2007 Tominaga ............ B62D 5/0406
                                                         180/444
2012/0326292 A1   12/2012 Ohashi et al.

OTHER PUBLICATIONS

Machine Translation, Nakanishi, JP 2007116840 A, May 10, 2007.\*
Office Action (2 pages) dated Dec. 16, 2014 issued in corresponding Japanese Application No. 2013-024227 and English translation (2 pages).

\* cited by examiner

ELECTRONIC CONTROL UNIT AND ROTATING ELECTRIC MACHINE

CROSS-REFERENCE TO RELATED APPLICATION

The present application is based on and claims the benefit of priority of Japanese Patent Application No. 2013-24227 filed on Feb. 12, 2013, the disclosure of which is incorporated herein by reference.

TECHNICAL FIELD

The present disclosure generally relates to an electronic control unit and a rotating electric machine using the same.

BACKGROUND

The semiconductor module of an electronic control unit (ECU) for a rotating electric machine may generate large amounts of heat during operation. As such, the ECU may have a radiator for dissipating heat produced by the semiconductor module. For example, in the ECU disclosed in a patent document 1 (i.e., Japanese Patent Laid-Open No. JP-A-2012-79741), the radiator is arranged on an opposite side of the semiconductor module relative to a substrate. That is, the substrate is interposed between the semiconductor module and the radiator. Therefore, the heat of the semiconductor module is transmitted to the radiator through the substrate.

In the above-described structure of the ECU in the patent document 1, the radiator has a board shape of a predetermined thickness to provide a large heat capacity. However, due to the substrate being interposed between the semiconductor module and the radiator, it is difficult to efficiently transfer heat from the semiconductor module to the radiator. Therefore, heat of the semiconductor module may be retained, thereby causing an abnormal operation of the semiconductor module.

Further, in the electronic control unit of the patent document 1, the semiconductor module has a cover member disposed on an opposite side of the radiator of the substrate. Heat of the semiconductor module is transmitted to the cover member through a heat conducting member. The cover member is intended to further facilitate a heat transfer during operation of the semiconductor module. However, the cover member has a small board thickness in comparison to the radiator. As a result, the heat capacity of the cover member is small. Therefore, heat transfer from the semiconductor module by the cover member in the patent document 1 may not be sufficient.

SUMMARY

It is an object of the present disclosure to provide an electronic control unit with improved heat transfer from a semiconductor module.

In an aspect of the present disclosure, the electronic control unit includes a substrate, a first circuit pattern and a second circuit pattern disposed on the substrate, a semiconductor chip electrically connected to the first circuit pattern and the second circuit pattern, and a resin body wrapped around a portion of the semiconductor chip and having a board shape with a first face facing the substrate and a second face facing away from the substrate. The electronic control unit also includes a first metal plate having a side connected to the semiconductor chip, and having an other side connected to the first circuit pattern, a radiator having a base portion and a first shaped portion, the base portion having a board shape with a predetermined thickness, the base portion disposed on an opposite side of the resin body relative to the substrate, the first shaped portion projecting from the base portion toward the first circuit pattern and forming a first gap that is defined between the first shaped portion and the first circuit pattern, and a first heat conductor disposed in the first gap and transmitting heat from the first circuit pattern to the radiator.

Further, the electronic control unit includes a second metal plate disposed on an opposite side of the semiconductor chip relative to the first metal plate to sandwich the semiconductor chip between the first metal plate and the second metal plate, the second metal plate having a side connected to the semiconductor chip and an other side facing away from the second face of the resin body, a second shaped portion of the radiator projecting from the base portion toward the second metal plate to form a second gap that is defined between the second shaped portion and the second metal plate, and a second heat conductor disposed in the second gap to transmit heat of the second metal plate to the radiator.

Moreover, the electronic control unit includes a third shaped portion of the radiator projecting from the base portion and toward the second circuit pattern to form a third gap that is defined between the third shaped portion and the second circuit pattern, and a third heat conductor disposed in the third gap to transmit heat of the second circuit pattern to the radiator.

Even further, the electronic control unit includes a boss projecting from the base portion of the radiator, such that at least one of the substrate, the first circuit pattern, or the second circuit pattern is abuttingly fastened to the boss.

Additionally, the electronic control unit has a support projecting from the base portion of the radiator to a position abutting at least one of one of the substrate, the first circuit pattern, and the second circuit pattern.

Further, the electronic control unit has an electrically-insulating protective coat covering a portion of the first circuit pattern that is not in contact with the first heat conductor.

Moreover, the electronic control unit has an electrically-insulating protective coat covering a portion of the second circuit pattern that is not in contact with the third heat conductor.

Even further, the second shaped portion has a surface that faces the resin body, the surface having an area that is equal to or greater than an area of the second face of the resin body.

Additionally, the electronic control unit has at least one of a diode, an IC, a coil, or a capacitor is connected to the first circuit pattern or the second circuit pattern.

Further, the electronic control unit has a first airgap disposed between the base portion and the resin body, and a second airgap disposed between the first shaped portion and the resin body.

In another aspect of the present disclosure, a rotating electric machine has a motor case having a cylindrical shape, an end cap positioned at an axial end of the motor case, a stator housed in the motor case, a rotor rotatably disposed inside of the stator, a shaft disposed at a center of the rotor, and a winding wound on the stator. The rotating electric machine also has an electronic control unit positioned at the axial end of the motor case and controlling a supply of electric power to the winding, the electronic control unit having a substrate, a first circuit pattern and a second circuit pattern disposed on the substrate, a semiconductor chip electrically connected to the first circuit pattern and the second circuit pattern, and a resin body wrapped around a portion of the semiconductor chip and having a board shape with a first face facing the substrate and a second face facing away from the substrate. The rotating electric machine has a first metal plate having a side connected to the semiconductor chip, and having an other side connected to the first circuit pattern, a radiator having a base portion and a first shaped portion, the base portion having a board shape with a predetermined thickness, the base portion disposed on an opposite side of the resin body relative to the substrate, the first shaped portion projecting from the base portion toward the first circuit pattern and forming a first gap that is defined between the first shaped portion and the first circuit pattern, and a first heat conductor disposed in the first gap and transmitting heat from first circuit pattern to the radiator, such that the radiator is formed either (i) as a single body with the end cap, (ii) separate from and abutting the end cap, or (iii) separate from and in thermal connection with the end cap.

As described above, in the present disclosure, the first shaped portion of the radiator is formed and configured to project to the proximity of the first circuit pattern, and the first heat conducting member is disposed in the first gap between the first shaped portion and the first circuit pattern. Therefore, heat generated by the semiconductor chip is efficiently transmitted to the radiator through the first metal plate, the first circuit pattern, and the first heat conducting member at the time of the operation of the semiconductor module. Further, the base part of the radiator has the predetermined thickness that provides a predetermined (i.e., a large) heat capacity. Thereby, heat transfer from the semiconductor module to the radiator is increased. Therefore, the size of the electronic control unit is reduced.

BRIEF DESCRIPTION OF THE DRAWINGS

Other objects, features and advantages of the present disclosure become more apparent from the following detailed description disposed with reference to the accompanying drawings, in which.

DETAILED DESCRIPTION

Multiple embodiments of an electronic control unit regarding the present disclosure are described with reference to the drawings in the following, together with a rotating electric machine using such electronic control unit. In those embodiments, like parts have like numbers, for the brevity of the description.

First Embodiment

Figure 1A:
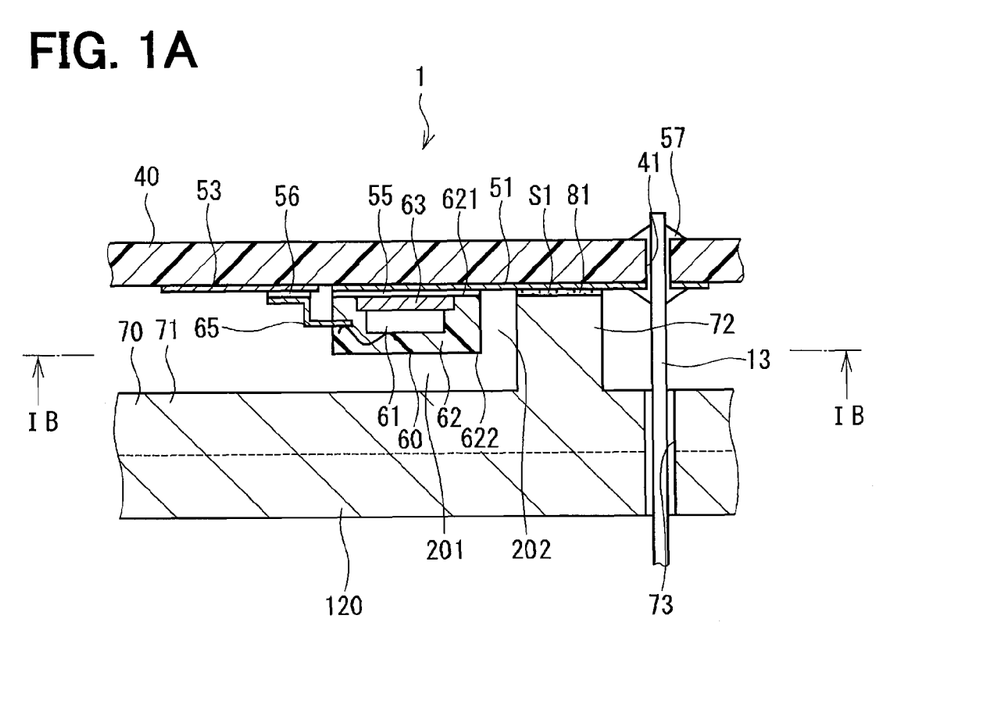
FIG. 1A is a cross-sectional view of an electronic control unit (ECU) in a first embodiment of the present disclosure.
Figure 1B:
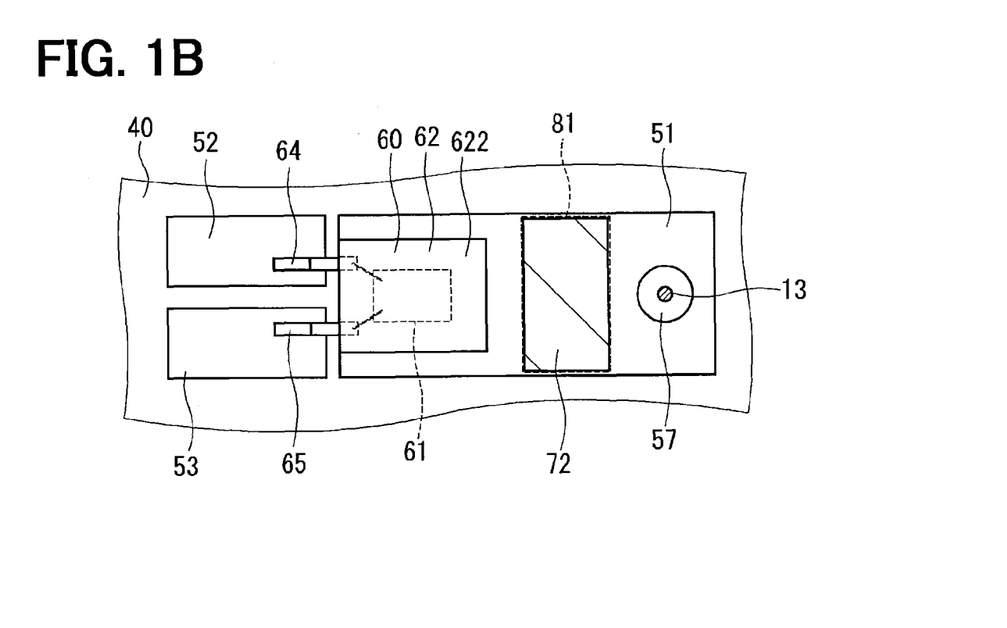
FIG. 1B is a cross-sectional view of the ECU along a line IB-IB in FIG. 1A.
Figure 2:
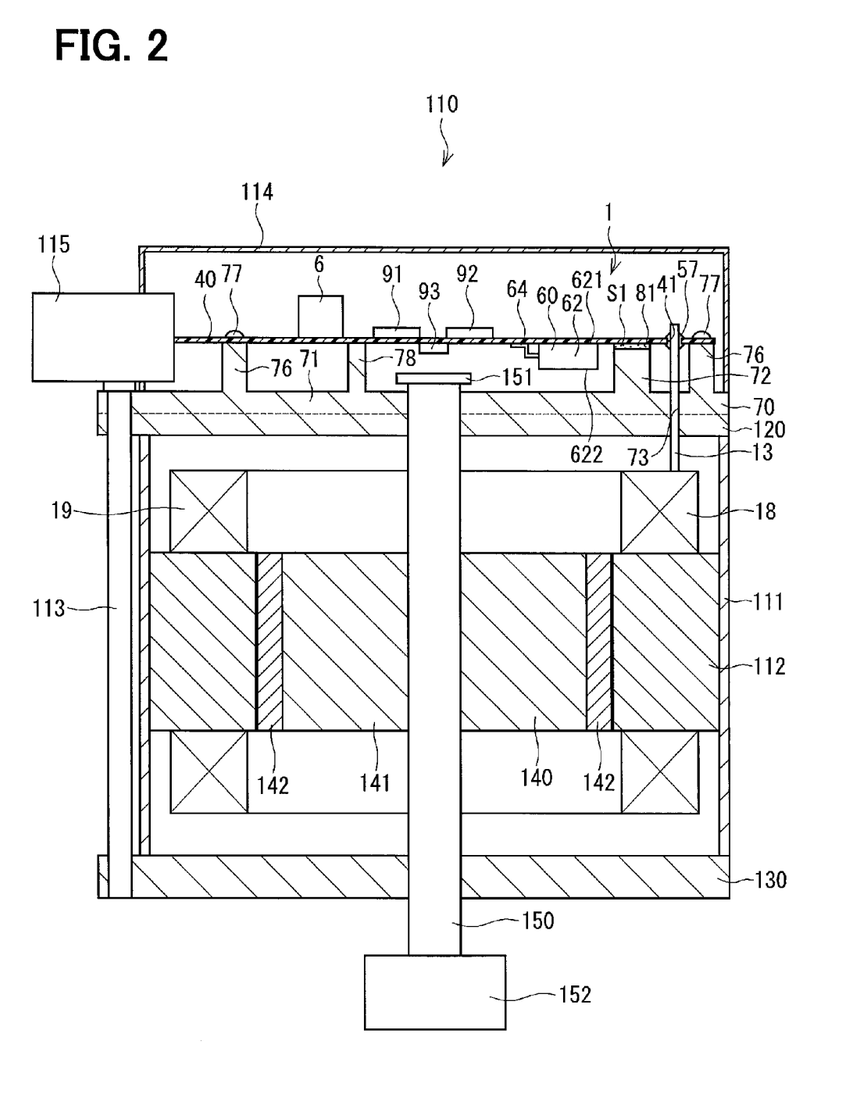
FIG. 2 is a cross section of a motor utilizing the ECU in the first embodiment of the present disclosure.

An electronic control unit (ECU) in the first embodiment of the present disclosure and a rotating electric machine using such ECU are shown in FIGS. 1A/B and 2. A rotating electric machine 110 is adopted as a power source of an electric power steering apparatus, for example, for providing assistance for a steering operation when it receives an electric power supply.

Figure 3:
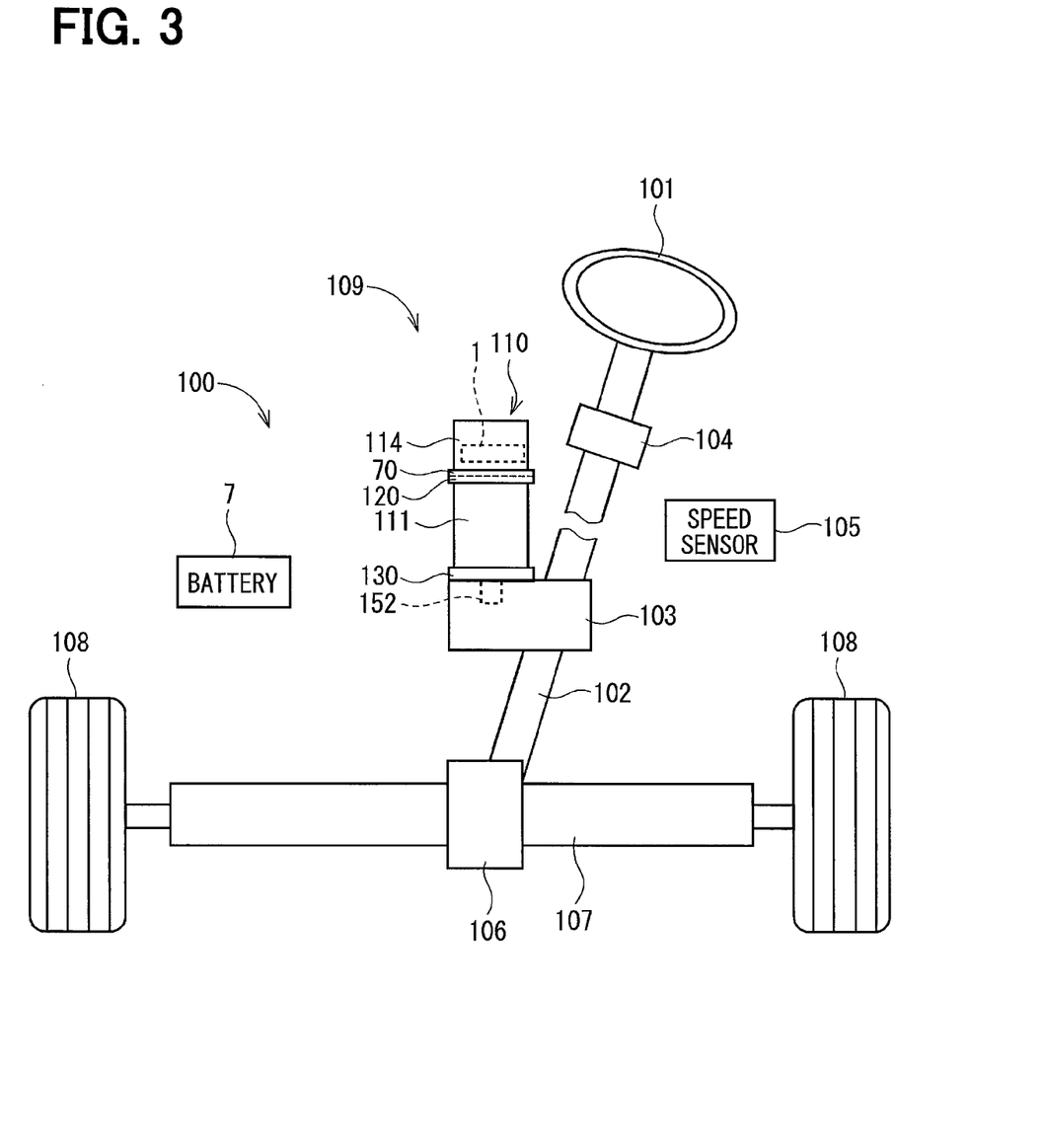
FIG. 3 is a schematic diagram of an electric power steering apparatus utilizing the ECU in the first embodiment of the present disclosure.

FIG. 3 shows an entire configuration of a steering system 100 provided with an electric power steering apparatus 109. In the electric power steering apparatus 109, a torque sensor 104 is disposed on a steering shaft 102 that is the vehicle.

At a tip of the steering shaft 102, a pinion gear 106 is disposed, and the pinion gear 106 engages with the rack shaft 107. A pair of tires 108 is rotatably connected to both ends of the rack shaft 107 with a tie rod or a similar part.

When the driver rotates the steering wheel 101, the steering shaft 102 connected to the steering wheel 101 rotates in such structure, and a rotational movement of the steering shaft 102 is converted into a linear movement of the rack shaft 107 by the pinion gear 106. The pair of the tires 108 are steered by an angle in proportion to a displacement in the linear movement of the rack shaft 107.

The electric power steering apparatus 109 is provided with the rotating electric machine 110 which generates a steering assist torque as well as a speed reduction gear 103 for reducing a rotation speed of the rotating electric machine 110 to transfer the rotation to the steering shaft 102. According to the present embodiment, the rotating electric machine 110 is attached to the speed reduction gear 103.

The rotating electric machine 110 is a three-phase-drive type brushless motor, and is driven by receiving a supply of electric power from a battery 7, for example. The rotating electric machine 110 rotates the speed reduction gear 103 in both forward and backward rotation directions. The electric power steering apparatus 109 includes the above-mentioned torque sensor 104 and a speed sensor 105 which detects a vehicle speed.

In such configuration, the electric power steering apparatus 109 generates a steering assist torque for assisting the steering wheel 101 from the rotating electric machine 110 based on signals from the torque sensor 104 and the speed sensor 105. The torque is transmitted to the steering shaft 102 via the speed reduction gear 103.

As shown in FIG. 2, the rotating electric machine 110 is provided with an ECU 1, a case 111, end caps 120 and 130, a stator 112, a rotor 140, a shaft 150, a first winding group 18, and a second winding group 19, together with other parts.

The case 111 has a cylindrical shape and is made of metal such as aluminum, for example. The end cap 120 has a board shape and is made of metal such as aluminum, for example, and is disposed to close one end of the case 111. The end cap 130 has a board shape and is made of metal such as aluminum, for example, and is disposed to cover the other end of the case 111. The end cap 120 and the end cap 130 are being fixed with multiple bolts 113.

The stator 112 is made of metal such as iron and has a ring shape, for example. The stator 112 is fixed inside of the case 111.

The rotor 140 has a core 141 and a magnet 142. The core 141 has a cylindrical shape, for example, and is made of metal such as iron. The magnet 142 is attached on an outer wall of the core 141.

The shaft 150 has a cylindrical shape made of metal, for example. The shaft 150 is disposed in a position that extends or passes through the center of the core 141 of the rotor 140.

One end of the shaft 150 is held within the end cap 120 by a bearing in a hole that is bored at the center of the end cap 120. The other end of the shaft 150 is held within the end cap 130 by a bearing in another hole that is bored at the center of the end cap 130. Thereby, the rotor 140 is rotatably supported within an inside of the stator 112.

A magnet 151 is disposed on one end of the shaft 150. An output end 152 is disposed on the other end of the shaft 150. The rotating electric machine 110 is disposed to have the output end 152 engaged with the speed reduction gear 103.

Figure 4:
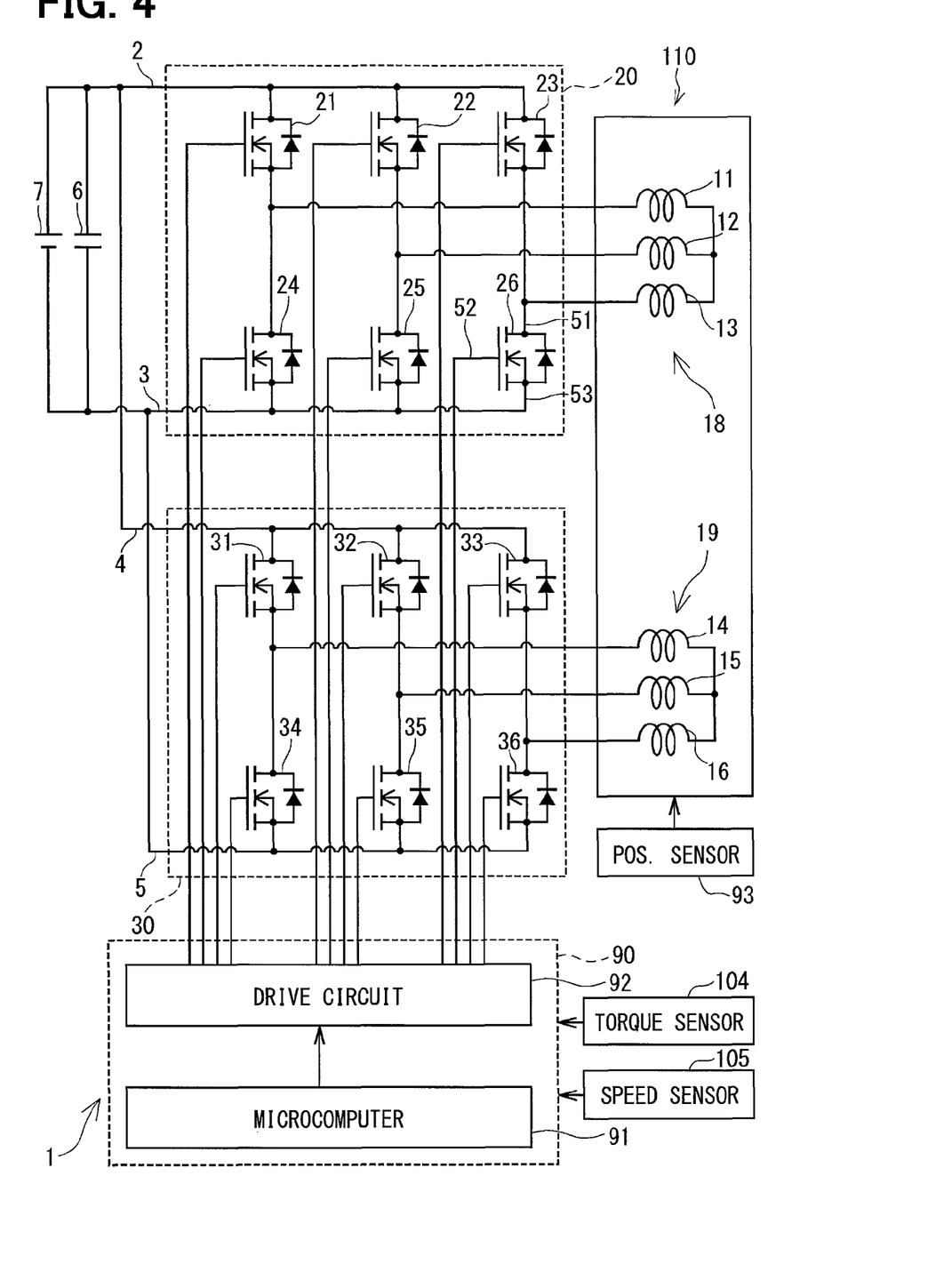
FIG. 4 is a circuit configuration of the ECU in the first embodiment of the present disclosure.

The first winding group 18 and the second winding group 19 are disposed to be wound around the stator 112. As shown in FIG. 4, the first winding group 18 includes coils 11, 12, 13, and the second winding group 19 includes coils 14, 15, 16. Here, the first winding group 18 and the second winding group 19 correspond to a "winding" in the claims.

The ECU 1 is disposed on one end of the case 111. A cover member 114 is also disposed on the same end of the case 111. The cover member 114 is formed by pressing a material such as aluminum, iron or the like, into a cylinder shape having a bottom. The cover member 114 is disposed to cover the ECU 1.

Next, an electric configuration of the ECU 1 is explained based on FIG. 4.

As shown in FIG. 4, the ECU 1 is provided with a first inverter 20, a second inverter 30, a capacitor 6, a controller 90, together with other parts.

The first inverter 20 is a three-phase inverter, and is formed as a bridge connection of six semiconductor modules 21-26 for switching a power supply to the coils 11, 12, 13, in the first winding group 18 therethrough. The semiconductor modules 21-26 are MOSFETs (i.e., Metal-Oxide-Semiconductor Field-Effect Transistor) which is a type of a field-effect transistor in the present embodiment. Hereafter, the semiconductor modules 21-26 may also be designated as MOSFETs 21-26.

The three MOSFETs 21-23 have their drains connected to an upper bus line 2 that leads to a positive terminal of the battery 7. Further, the source of each of MOSFETs 21-23 is connected to the drain of each of MOSFETs 24-26, respectively. The source of each of MOSFETs 24-26 is connected to a lower bus line 3 that leads to a negative terminal of the battery 7 (i.e., to a ground).

A junction point between the paired MOSFETs 21 and 24 is connected to one end of the coil 11. A junction point of between the paired MOSFETs 22 and 25 is connected to one end of the coil 12. A junction point between the paired MOSFETs 23 and 26 is connected to one end of the coil 13.

The second inverter 30 is also a three-phase inverter, and is formed as a bridge connection of six semiconductor modules 31-36 for switching a power supply to the coils 14, 15, 16 in of the second winding group 19 therethrough, similar to the first inverter 20. The semiconductor modules 31-36 are MOSFETs, similar to semiconductor modules 21-26. Hereafter, the semiconductor modules 31-36 may also be designated as MOSFETs 31-36.

The three MOSFETs 31-33 have their drains connected to an upper bus line 4 that leads to a positive terminal of the battery 7. Further, the source of each of MOSFETs 31-33 is connected to the drain of each of MOSFETs 34-36, respectively. The source of each of MOSFETs 34-36 is connected to a lower bus line 5 that leads to a negative terminal of the battery 7 (i.e., to a ground).

A junction point between the paired MOSFETs 31 and 34 is connected to one end of coil 14. A junction point between the paired MOSFETs 32 and 35 is connected to one end of the coil 15. A junction point between the paired MOSFETs 33 and 36 is connected to one end of the coil 16.

Thus, in the present embodiment, the ECU 1 has two systems of inverters, that is, the first inverter 20 and the second inverter 30. Hereafter, a system having the first inverter 20 may be designated as a "first system", and a system having the second inverter 30 may be designated as a "second system".

The capacitor 6 is a device for storing an electric charge, in connection to the battery 7, the first inverter 20, and the second inverter 30. The capacitor 6 supplements an electric power supply to the MOSFETs 21-26, 31-36. The capacitor 6 may also control noise components, such as a surge current.

The controller 90 controls an entirety of the ECU 1, and includes a microcomputer 91, a register (not illustrated), a drive circuit 92, and the like.

The controller 90 is connected to a position sensor 93, the torque sensor 104, and the speed sensor 105. Thereby, the controller 90 is capable of acquiring a rotation position θ which represents a rotation position of the rotating electric machine 110 from the position sensor 93, a steering torque Tq* from the torque sensor 104, and a vehicle speed Vdc from the speed sensor 105. Further, the controller 90 is capable of detecting an electric current flowing in each of the coils 11-16.

Next, a process performed by the controller 90 is explained. The process is in regards to a drive control of the rotating electric machine 110. Hereafter, even though the process is described as being performed by the first inverter 20, the same process may also be performed by the second inverter 30.

The controller 90 reads an electric current detection value memorized by the register. Further, a d axis current detection value Id and a q axis current detection value Iq are computed based on an electric current value U1 of the coil 11, an electric current value V1 of the coil 12, and an electric current value W1 of the coil 13, respectively derived from an electric current detection value, and based further on the derived three-phase electric current values U1, V1, W1 and a rotation position θ acquired by the position sensor 93.

The controller 90 computes a d axis instruction current Id* and a q axis instruction current Iq* based on a rotation position θ acquired by the position sensor 93, a steering torque Tq* acquired by the torque sensor 104, and a vehicle speed Vdc acquired by the speed sensor 105. Then, the controller 90 performs, based on the d axis instruction current Id*, the q axis instruction current Iq*, the d axis current detection value Id and the q axis current detection value Iq, an electric current feedback control calculation, and computes a d axis instruction voltage Vd and a q axis instruction voltage Vq.

Further, the controller 90 computes, based on the computed instruction voltages Vd, Vq and the rotation position θ, a U phase instruction voltage Vu*, a V phase instruction voltage Vv* and a W phase instruction voltage Vw*, as three-phase voltage instruction values.

Further, the controller 90 computes, based on three-phase voltage Vu*, Vv*, Vw*, and a capacitor voltage Vc, a U phase duty Du, a V phase duty Dv and a W phase duty Dw as duty instruction signals, and writes those duties Du, Dv, Dw in the register.

Then, by comparing the duty instruction signals with a PWM reference signal in the drive circuit 92, ON-and-OFF switch timings of MOSFETs 21-26 are controlled.

By controlling the ON-and-OFF of MOSFET 21-26 with the drive circuit 92, a voltage is applied to the coils (i.e., coils 11-13) in each of three phases (i.e., U phase, V phase, W phase). When a voltage vector is changed continuously, a sine wave voltage is applied to the coil in each phase.

If a certain voltage is applied to the coil in each phase, an electric current according to the applied voltage flows into each coil (i.e., coils 11-13). In such manner, a torque (Tq1) is generated in the rotating electric machine 110 by the first inverter 20 (i.e., the first system). Further, based on the same control for the second inverter 30 (i.e., the second system) as the first inverter 20, a torque (Tq) that is a sum of the torque (Tq1) by the first inverter 20 and a torque (Tq2) by the second inverter 30 is generated in the rotating electric machine 110. The torque (Tq) generated in such manner is then inputted into the steering shaft 102 via the speed reduction gear 103, and the inputted torque serves as an assist torque for assisting a driver's steering operation.

Next, a physical/structural configuration of the ECU 1 is explained based on FIGS. 1A/B.

As shown in FIGS. 1A/B, the ECU 1 is provided with a substrate 40, a first circuit pattern 51, second circuit patterns 52 and 53, a semiconductor module 60, a radiator 70, a first heat conductor 81 and the like.

The substrate 40 is a printed circuit board such as an FR-4 or the like, which is made of a glass fiber, an epoxy resin or the like, for example. The substrate 40 is disposed on an opposite side of the rotor 140 relative to the end cap 120, and is covered by the cover member 114.

The first circuit pattern 51 is made of a metallic thin film such as copper, for example, and is disposed on one face of the substrate 40 which faces the end cap 120. The second circuit patterns 52 and 53 are made of a metallic thin film such as copper, and are disposed on a face of the substrate 40 facing the end cap 120, similar to the first circuit pattern 51.

The first circuit pattern 51 and the second circuit patterns 52 and 53 are formed on a face of the substrate 40 by various methods, such as a subtractive process or an additive process, for example.

The semiconductor module 60 includes a semiconductor chip 61, a resin body 62, a first metal plate 63, terminals 64 and 65 and the like.

Here, the semiconductor module 60 shown in FIGS. 1A/B corresponds to the semiconductor module 26 shown in FIG. 4. That is, FIGS. 1A/B are sectional views of the semiconductor module 26 of the ECU 1. Although the semiconductor module 60 (26) and its proximity are mainly explained in the following, other semiconductor modules 21-25, 31-36 and their proximities are configured in the same manner.

The semiconductor chip 61 is configured to establish and interrupt a connection (i.e., an electric current), between the source and the drain, according to a control signal that is inputted to the gate. That is, the semiconductor chip 61 has a switch function.

The resin body 62 has a board shape made of resin, and covers the semiconductor chip 61. Thereby, the semiconductor chip 61 is protected from a shock, humidity, etc of its environment. According to the present embodiment, the resin body 62 is formed in a rectangular board shape. Therefore, the resin body 62 has a first face 621, a second face 622 on the other side (i.e., a reverse side), and four side faces that are positioned between the face 621 and the face 622.

The first metal plate 63 is formed in a rectangular board shape which is made of metal such as copper, for example.

The first metal plate 63 has a side abutting the semiconductor chip 61, while it is electrically connected to the drain of the semiconductor chip 61. The first metal plate 63 has an other side positioned on the same plane as the face 621 of the resin body 62 by being positioned on one side of the resin body 62 which has the face 621. In such manner, the first metal plate 63 is covered by the resin body 62 except for the other side. That is, the other side of the first metal plate 63 is exposed from the face 621 of the resin body 62. The first metal plate 63 has the other side soldered to the first circuit pattern 51 by using a solder 55.

The terminals 64 and 65 are made of metal such as copper, for example.

The terminal 64 has one end electrically connected to the gate of the semiconductor chip 61, and has the other end exposed from the side face of the resin body 62. The terminal 64 is, after projecting out from the side face of the resin body 62, bent toward a face 621, and is further bent toward an opposite direction away from the resin body 62 at its tip (i.e., at the other end). The terminal 64 has the other end soldered to the second circuit pattern 52 by using a solder 56.

The terminal 65 has one end electrically connected to the source of the semiconductor chip 61, and has the other end exposed from the side face of the resin body 62. The terminal 65 is, after projecting out from the side face of the resin body 62, bent toward a face 621, and is further bent toward an opposite direction away from the resin body 62 at its tip (i.e., at the other end). The terminal 65 has the other end soldered to the second circuit pattern 53.

As mentioned above, the semiconductor module 60 in the present embodiment is surface-mounted on one face of the substrate 40 which faces the end cap 120. That is, the semiconductor module 60 is an SMD-type electronic part. The ECU 1 has twelve pieces of the semiconductor modules 60 (i.e., 21-26, 31-36) mounted thereon.

The radiator 70 is made of metal such as aluminum for example, and has a base portion 71 and a first shaped portion 72, together with other parts.

The base portion 71 is formed in a board shape of predetermined thickness, and is disposed on an opposite side of the semiconductor module 60 relative to the substrate 40. According to the present embodiment, the base portion 71 is formed as a single body with the end cap 120 on an opposite side of the rotor 140 relative to the end cap 120. In this case, the base portion 71 is configured to have a volume and thickness respectively greater than the volume and thickness of the cover member 114. Naturally, the volume and thickness of the base portion 71 and the end cap 120 in a single body is respectively greater than the volume and the thickness of the cover member 114.

The first shaped portion 72 projects from the base portion 71 toward a proximity of the first circuit pattern 51, and defines a first gap S1 which is a space between the part 72 and the first circuit pattern 51. In the present embodiment, the first shaped portion 72 is formed in a rectangular pillar shape.

The first heat conductor 81 is made of a glass fiber cloth having a predetermined thickness, for example. A silicone rubber containing fillers such as boron nitride, alumina or the like is applied, for example, onto both surfaces of the first heat conductor 81. Thereby, the first heat conductor 81 has a comparatively high electrical insulation and heat conductivity. Further, the first heat conductor 81 is elastically deformable because the first heat conductor 81 contains the silicone rubber. The first heat conductor 81 is positioned between the first circuit pattern 51 and the first shaped portion 72 as shown in FIG. 1A and FIG. 1B. That is, the first heat conductor 81 is disposed in the first gap S1.

As shown in FIG. 1A, a hole 73 is bored through the base portion 71 and the end cap 120 along a thickness direction of the board shape radiator 70, which pierces both of the base portion 71 and the end cap 120. One end of the coil 13 is inserted into the hole 73. One end of the coil 13 is also inserted into a hole 41 that is bored on the substrate 40 and the first circuit pattern 51. The hole 41 is filled up with a solder 57. Thereby, one end of the coil 13 is fixed to the substrate 40 while electrically being connected to the first circuit pattern 51 (i.e., is soldered).

As shown in FIG. 2, in the present embodiment, the radiator 70 has a boss 76 and a support 78.

The boss 76 projects from the base portion 71 of the radiator 70 to contact the substrate 40. According to the present embodiment, multiple bosses 76 are provided. The substrate 40 is, in an abutted state of contact with the boss 76, screwed onto the boss 76 with a threaded screw 77. Similarly, the first circuit pattern 51 or the second circuit patterns 52, 53 may also be abuttingly fastened to the boss. Here, a height of the boss 76 from the base portion 71 is substantially equal to a sum total of a height of the first shaped portion 72 from the base portion 71 and a thickness of the first gap S1 plus the first circuit pattern 51. Thereby, the substrate 40 is fixed onto the boss 76, with the first gap S1 formed between the first shaped portion 72 and the first circuit pattern 51.

The support 78 projects from the base portion 71 of the radiator 70 to contact the substrate 40. In this case, a height of the support 78 from the base portion 71 is substantially equal to a sum total of a height of the first shaped portion 72 from the base portion 71 and a thickness of the first gap S1 plus the first circuit pattern 51, similar to the boss 76. Thereby, even if the substrate 40 warps, for example, the first gap S1 is securely defined between the first shaped portion 72 and the first circuit pattern 51. Alternatively, the support 78 may also abut or contact the first circuit pattern 51 and/or the second circuit patterns 52, 53.

Further, the support 78 has a smaller volume than the boss 76, because the support 78 is, unlike the boss 76, not required to be fixed onto the substrate 40 by the threaded screw 77.

The first gap S1 is securely formed by the boss 76 and the support 78, and the insulation between the first circuit pattern 51 and the first shaped portion 72 is securely established.

As shown in FIG. 2, the substrate 40 has, on an opposite side face that is opposite to the semiconductor module 60, the capacitor 6, the microcomputer 91, the drive circuit 92 and the like mounted thereon. The capacitor 6, the microcomputer 91, and the drive circuit 92 may also be mounted on an other face of the substrate 40 which faces the semiconductor module 60. Further, on the same face (i.e., a module 60 side face) of the substrate 40 at a position that is pointed by an axis of the shaft 150, the position sensor 93 is disposed. The position sensor 93 detects the rotation position θ of the rotating electric machine 110 based on a change of a magnetic field from the rotating magnet 151.

Further, on an opposite side of the rotor 140 relative to the base portion 71 of the radiator 70 and the end cap 120, a connector 115 is disposed which is connected to an outer periphery of the substrate 40 and projects from the cover member 114 in a radially outward direction. The connector 115 is connected to a wire harness that is connected to the battery 7. Thereby, an electric power is supplied to the first inverter 20, the second inverter 30, the first winding group 18, and the second winding group 19 via the connector 115 from the battery 7.

At the time of the switching operation of the semiconductor module 60, a comparatively large electric current flows into the semiconductor chip 61 of the semiconductor module 60. Therefore, the semiconductor chip 61 generates heat and has a comparatively high temperature.

Heat of the semiconductor chip 61 is transmitted to the first shaped portion 72 of the radiator 70, the base portion 71, and the end cap 120 through the first metal plate 63, the solder 55, the first circuit pattern 51, and the first heat conductor 81. Thereby, heat of the semiconductor chip 61 is transferred. Thus, the radiator 70 and the end cap 120 serve as a heat sink.

Further, as shown in FIG. 1A, the base portion 71 and the first shaped portion 72 of the radiator 70 may be positioned relative to the resin body 62 of the semiconductor module 60 such that a first airgap 201 is defined between the base portion 71 and the resin body 62 and a second airgap 202 is defined between the first shaped portion 72 and the resin body 62. The first airgap 201 and the second airgap 202 prevent heat transfer from the radiator 70 to the resin body 62 of the semiconductor module 60.

As explained above, in the present embodiment, the first shaped portion 72 of the radiator 70 projects to a proximity of the first circuit pattern 51, and the first heat conductor 81 is provided in the first gap S1 between the first shaped portion 72 and the first circuit pattern 51. Therefore, heat generated from the semiconductor chip 61 is efficiently transmitted to the radiator 70 via the first metal plate 63, the first circuit pattern 51, and the first heat conductor 81 at the time of the operation of the semiconductor module 60. The radiator 70 has the base portion 71 that has a predetermined thickness in a board shape. In the present embodiment, the volume and the thickness of the base portion 71 of the radiator 70 are respectively greater than the volume and the thickness of the cover member 114. Therefore, the radiator 70 has a heat capacity that is greater than the cover member 114. In such manner, heat transfer from the semiconductor module 60 (21-26, 31-36) to the radiator 70 is increased. Thus, the volume of the ECU 1 is reduced.

Further, the ECU 1 is used for controlling rotation of the rotating electric machine 110 in the present embodiment. That is, the rotating electric machine 110 to which the ECU 1 of the present embodiment is applied is a rotating electric machine of a "mechanism-controller integrated type" in which a controller (i.e., the ECU 1) and a motor (i.e., the stator 112, the rotor 140, the shaft 150, the first winding group 18, and the second winding group 19) are combined to have a single body. Further, the end cap 120 of the rotating electric machine 110 is combined to have a single body with the radiator 70 of the ECU 1. In such manner, the radiator 70 and the end cap 120 are combined to have a greater heat capacity, thereby realizing an effective heat transfer capacity for conducting heat from the semiconductor module 60 (21-26, 31-36) of the ECU 1. Further, by combining two elements, an overall volume of the rotating electric machine 110 is reduced.

Second Embodiment

Figure 5A:
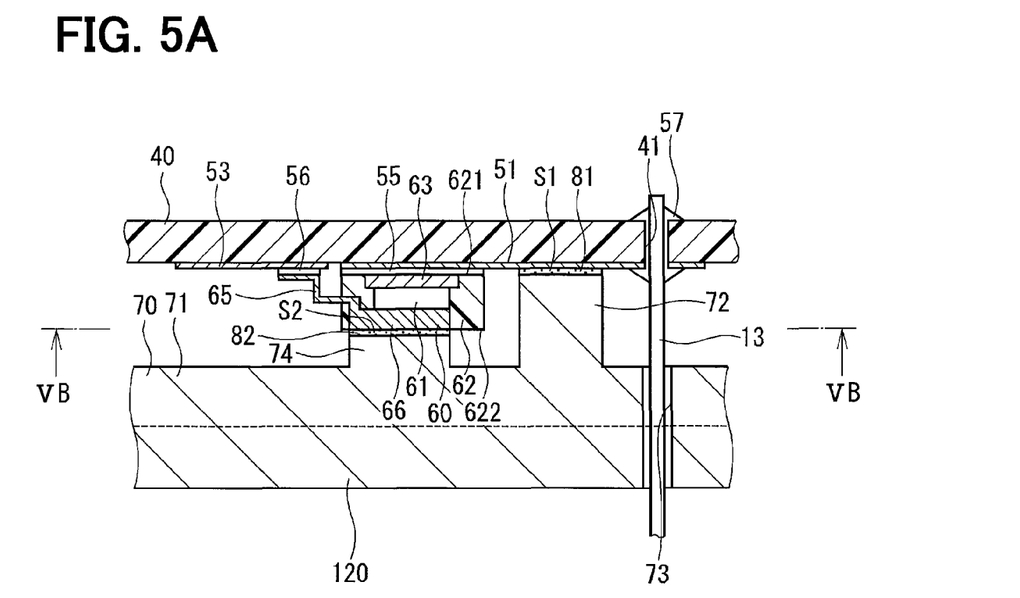
FIG. 5A is a cross-sectional view of the ECU in a second embodiment of the present disclosure.

A part of an electronic control unit in the second embodiment of the present disclosure is shown in FIGS. 5A/B. According to the second embodiment, the semiconductor module 60 has a second metal plate 66 added thereto. The second metal plate 66 has a rectangular board shape with a corner removed. The second metal plate 66 may be made of metal such as copper, for example. The second metal plate 66 and the first metal plate 63 are configured to sandwich the semiconductor chip 61. The second metal plate 66 has a side abutted onto the semiconductor chip 61 while being electrically connected to the source of the semiconductor chip 61. An other side of the second metal plate 66 is exposed from the face 622 of the resin body 62 (refer to FIG. 5B). In other words, the second metal plate (66) has a side connected to the semiconductor chip and an other side facing away from the second face (622) of the resin body 62.

Figure 5B:
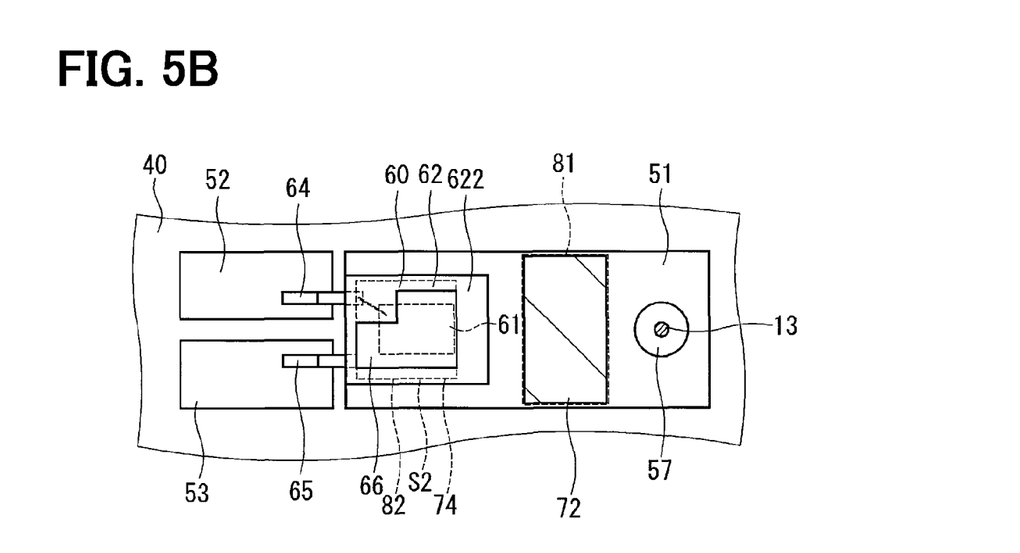
FIG. 5B is a cross-sectional view of the ECU along a line VB-VB in FIG. 5A.

According to the present embodiment, the terminal 65 is combined to have single body with the second metal plate 66, and has one end connect to the second metal plate 66. In such manner, the terminal 65 is connected to the source of the semiconductor chip 61 via the second metal plate 66.

According to the present embodiment, the radiator 70 has a second shaped portion 74 added thereto. The second shaped portion 74 projects from the base portion 71 toward a proximity of the second metal plate 66, to define a second gap S2 which is a space of predetermined thickness between the second shaped portion 74 and the second metal plate 66. According to the present embodiment, the second shaped portion 74 has a rectangular pillar shape.

In the present embodiment, a second heat conductor 82 is further provided. The second heat conductor 82 is made of a glass fiber cloth having a predetermined thickness, for example, and, onto both surfaces thereof, a silicone rubber containing fillers such as boron nitride, alumina or the like is applied. Thereby, the second heat conductor 82 has a comparatively high electrical insulation and heat conductivity. Further, the second heat conductor 82 is elastically deformable because the second heat conductor 82 contains the silicone rubber. The first heat conductor 82 is put in between the second metal plate 66 and the second shaped portion 74 as shown in FIG. 5A and FIG. 5B. That is, the second heat conductor 82 is disposed in the second gap S2 to transmit heat of the second metal plate to the radiator.

Further, in the present embodiment, a height of the boss 76 and a height of the support 78, respectively from the base portion 71, are substantially equal to (i) a sum total of a height of the first shaped portion 72 from the base portion 71, a thickness of the first gap S1, and the first circuit pattern 51 or (ii) a sum total of a height of the second shaped portion 74 from the base portion 71, a thickness of the second gap S2, a thickness of the resin body 62 of the semiconductor module 60, a thickness of the solder, and a thickness of the first circuit pattern 51, respectively.

In such manner, the first gap S1 and the second gap S2 are securely defined by the boss 76 and the support 78, and the insulation between the first circuit pattern 51 and the first shaped portion 72 as well as the insulation between the second metal plate 66 and the second shaped portion 74 are securely established.

In the present embodiment, heat of the semiconductor chip 61 is transmitted to the first shaped portion 72 of the radiator 70 via the first metal plate 63, the solder 55, the first circuit pattern 51, and the first heat conductor 81. Heat of the semiconductor chip 61 is also transmitted to the second shaped portion 74 of the radiator 70 via the second metal plate 66 and the second heat conductor 82. In such manner, heat of the semiconductor chip 61 is more efficiently transferred.

Third Embodiment

Figure 6A:
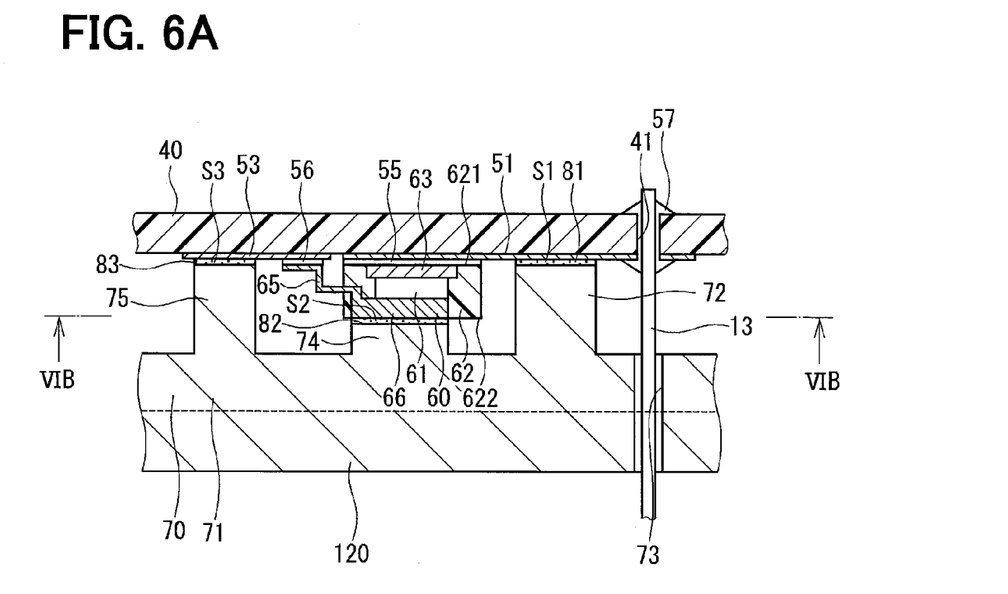
FIG. 6A is a cross-sectional view of the ECU in a third embodiment of the present disclosure.
Figure 6B:
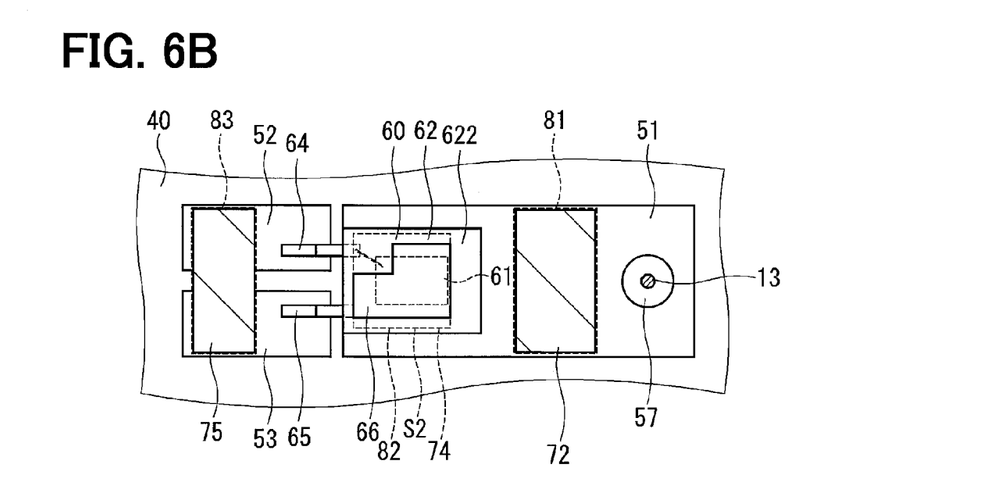
FIG. 6B is another cross-sectional view of the ECU along a line VIB-VIB in FIG. 6A.

A part of the electronic control unit in the third embodiment of the present disclosure is shown in FIGS. 6A/B. According to the third embodiment, the radiator 70 has a third shaped portion 75 added thereto. The third shaped portion 75 projects from the base portion 71 to reach a proximity of the second circuit patterns 52, 53, and defines a third gap S3 which is a space of predetermined thickness between the part 75 and the second circuit patterns 52, 53. According to the present embodiment, the third shaped portion 75 has a rectangular pillar shape.

In the present embodiment, a third heat conductor 83 is further provided. The third heat conductor 83 is made of a glass fiber cloth having a predetermined thickness, similar to the first heat conductor 81 and the second heat conductor 82, for example, and, onto both surfaces thereof, a silicone rubber containing fillers such as boron nitride, alumina or the like is applied. Thereby, the third heat conductor 83 has comparatively high electrical insulation and heat conductivity properties. Further, the third heat conductor 83 is elastically deformable because the third heat conductor 83 contains the silicone rubber. The third heat conductor 83 is, as shown in FIG. 6A and FIG. 6B, put in between the second circuit patterns 52, 53 and the third shaped portion 75. That is, the third heat conductor 83 is disposed in the third gap S3.

In the present embodiment, a height of the boss 76 and a projecting height of the support 78, respectively from the base portion 71, are substantially equal to (i) a sum total of a height of the first shaped portion 72 from the base portion 71, a thickness of the first gap S1, and the first circuit pattern 51, or (ii) a sum total of a height of the second shaped portion 74 from the base portion 71, a thickness of the second gap S2, a thickness of the resin body 62 of the semiconductor module 60, a thickness of the solder, and a thickness of the first circuit pattern 51 or (iii) a sum total of a height of the third shaped portion 75 from the main body 71, a thickness of the third gap S3, and a thickness of the second circuit patterns 52, 53. The first, second, and third gaps S1, S2, S3 are securely formed by the boss 76 and the support 78. The insulation between the first circuit pattern 51 and the first shaped portion 72, the insulation between the second metal plate 66 and the second shaped portion 74, and the insulation between the second circuit patterns 52 and 53 and the third shaped portion 75 are securely established.

In the present embodiment, heat of the semiconductor chip 61 is transmitted to the first shaped portion 72 of the radiator 70 through the first metal plate 63, the solder 55, the first circuit pattern 51, and the first heat conductor 81. Heat of the semiconductor chip 61 is also transmitted to the second shaped portion 74 of the radiator 70 through the second metal plate 66 and the second heat conductor 82. In addition, heat of the semiconductor chip 61 is also transmitted to the third shaped portion 75 of the radiator 70 through the second metal plate 66, the terminal 65, the solder 56, the second circuit patterns 52, 53, and the third heat conductor 83. Thereby, heat of the semiconductor chip 61 is more efficiently transferred.

Other Embodiments

In other embodiments of the present disclosure, the first heat conductor, the second heat conductor, and the third heat conductor may be a heat conducting gel-type grease with electric insulation characteristics and low thermal resistance, or may be an adhesive or the like having the same heat/electric insulation characteristics, respectively using a silicone base material, for example.

In other embodiments of the present disclosure, the electronic control unit may have the second shaped portion and the second heat conductor only, without having the first and third shaped portions and the first and third heat conductors. Alternatively, the electronic control unit may have the third shaped portion and the third heat conductor only, without having the first and second shaped portions and the first and second heat conductors. Further, the electronic control unit may have the second and third shaped portions and the second and third heat conductors, without having the first shaped portion and the first heat conductor. Further, the electronic control unit may have the first and third shaped portions and the first and third heat conductors, without having the second shaped portion and the second heat conductor.

In other embodiments of the present disclosure, the first circuit pattern, the second circuit patterns, or other circuit patterns may be disposed at a position between the boss or the support of the radiator and the substrate. In such case, a height of the boss or the support from the base part may preferably be substantially same as one of (i) a sum total of a height of the first shaped portion from the base part and a thickness of the first gap, or (ii) a sum total of a height of the second shaped portion from the base part, a thickness of the second gap, a thickness of the resin body of the semiconductor module, and a thickness of the solder, or (iii) a sum total of a height of the third shaped portion from the base part and a thickness of the third gap.

Further, in other embodiments of the present disclosure, multiple supports may be provided. Furthermore, the radiator may be dispensed with one of the boss or the support.

Figure 7:
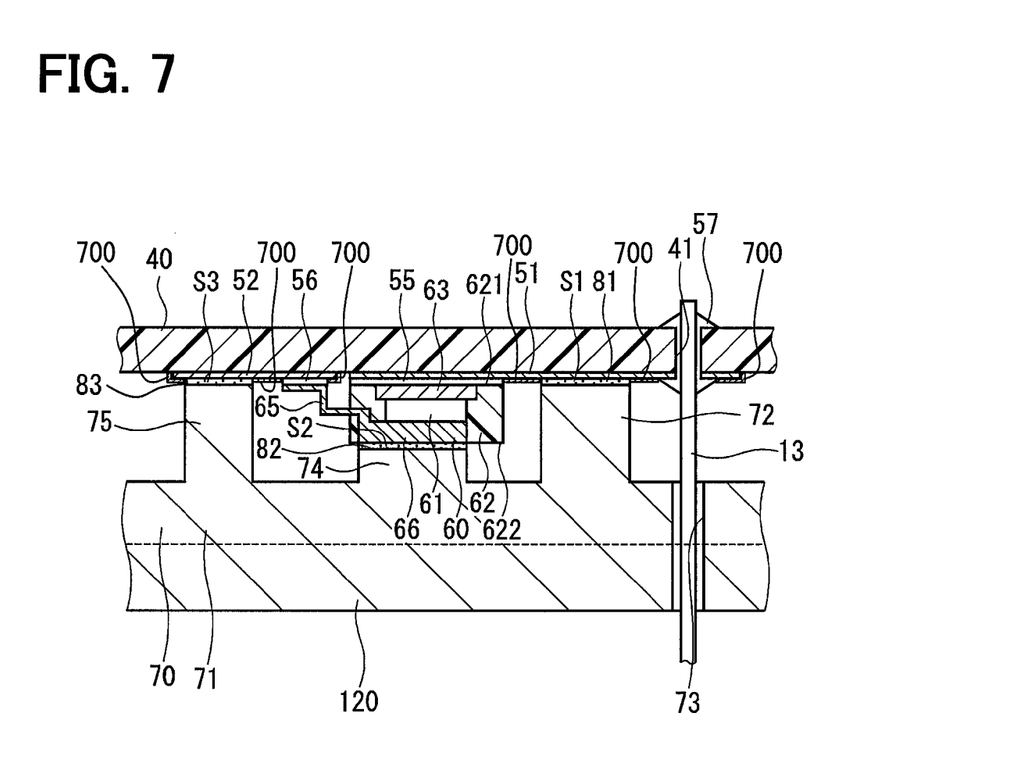
FIG. 7 is a cross-sectional view of the ECU in a fourth embodiment of the present disclosure.

In another embodiments of the present disclosure, as illustrated in FIG. 7 as a fourth embodiment, for example, the first circuit pattern 51 may be covered by an electrically-insulating protective coat 700 such as a solder resist coating or the like at the other portion other than a portion that is in contact with the first heat conductor 81. Further, the second circuit patterns 52, 53 may also be covered by the electrically-insulating protective coat 700 such as a solder resist coating or the like at the other portion other than a portion that is in contact with the third heat conductor 83. In other words, an electrically-insulating protective coat 700 may cover a portion of the first circuit pattern 51 that is not in contact with the first heat conductor 81 and/or a portion of the second circuit patterns 52, 53 that is not in contact with the third heat conductor 83. In such manner, heat transfer may occur at contacting portions, i.e., at a portion of the first circuit pattern 51 in contact with the first heat conductor 81 and at a portion of the second circuit patterns 52, 53 in contact with the second heat conductor 83, and the insulation capacity is secured for the other portions.

In other embodiments of the present disclosure, a semiconductor-module-facing face of the second shaped portion may have the same area size as or a greater area size than the second face of the semiconductor module. In such case, by disposing the second heat conductor in the second gap between (i) the second shaped portion and (ii) the second metal plate and the resin body, heat of the semiconductor chip may be transmitted to the second shaped portion through the second metal plate, the resin body, and the second heat conductor.

In other embodiments of the present disclosure, the first circuit pattern or the second circuit patterns may have at least one of a diode, an IC, a coil, and a capacitor being connected thereto. In such configuration, heat from heat generating components, i.e., from the diode, the IC, the coil, and the capacitor may be transmitted to the radiator through the first circuit pattern or the second circuit patterns. Thereby, not only the heat of the semiconductor module but also the heat of the heat generating components are effectively transferred.

Further, in other embodiments of the present disclosure, an electronic control unit may have only one system of inverter.

Further, in other embodiments of the present disclosure, the radiator may be formed to have a separate body from the end cap, and may be in contact with the end cap, or may be disposed at a proximity of the end cap. In such manner, an ease of assembly, combining a controller part (i.e., an electronic control unit) and a motor part (i.e., an end cap, a case, a stator, a rotor, etc.), is improved, and the heat transfer capacity of the semiconductor module is secured.

Further, in other embodiments of the present disclosure, the electronic control unit is not required to be a part of the rotating electric machine. That is, the rotating electric machine may be not a mechanism-controller integrated type but a mechanism-controller separate type, in which the controller and the motor have separate bodies and are disposed at separate positions.

Further, the electronic control unit in the present disclosure may be used for controlling not only the rotating electric machine of the electric power steering apparatus but may also be used to control the rotating electric machine of other devices and systems.

Although the present disclosure has been fully described in connection with the above embodiment thereof with reference to the accompanying drawings, it is to be noted that various changes and modifications will become apparent to those skilled in the art, and such changes and modifications are to be understood as being within the scope of the present disclosure as defined by the appended claims.

What is claimed is:

1. An electronic control unit comprising:
a substrate;
a first circuit pattern and a second circuit pattern disposed on the substrate;
a semiconductor chip electrically connected to the first circuit pattern and the second circuit pattern;
a resin body wrapped around a portion of the semiconductor chip and having a board shape with a first face facing the substrate and a second face facing away from the substrate;
a first metal plate having a side connected to the semiconductor chip and having an other side connected to the first circuit pattern;
a radiator having a base portion and a first shaped portion, the base portion having a board shape with a predetermined thickness, the base portion disposed on an opposite side of the resin body relative to the substrate, the first shaped portion projecting from the base portion toward the first circuit pattern and forming a first gap that is defined between the first shaped portion and the first circuit pattern;
a first heat conductor disposed in the first gap and transmitting heat from the first circuit pattern to the radiator;
a second metal plate disposed on an opposite side of the semiconductor chip relative to the first metal plate to sandwich the semiconductor chip between the first metal plate and the second metal plate, the second metal plate having a side connected to the semiconductor chip and an other side facing away from the second face of the resin body;
a second shaped portion of the radiator projecting from the base portion toward the second metal plate to form a second gap that is defined between the second shaped portion and the second metal plate; and
a second heat conductor disposed in the second gap to transmit heat of the second metal plate to the radiator,
wherein the radiator further comprises a boss and a support projecting from the base portion of the radiator as one body, the boss and the support abutting at least one of the substrate, the first circuit pattern and the second circuit pattern, and
the second shaped portion has a surface that faces the resin body, the surface has an area that is equal to or greater than an area of the second face of the resin body, and the second shaped portion is unitary with and projects directly from the base portion toward the second metal plate.

2. The electronic control unit of claim 1, further comprising:
a third shaped portion of the radiator projecting from the base portion and toward the second circuit pattern to form a third gap that is defined between the third shaped portion and the second circuit pattern; and
a third heat conductor disposed in the third gap to transmit heat of the second circuit pattern to the radiator.

3. The electronic control unit of claim 1, wherein
the at least one of the substrate, the first circuit pattern, and the second circuit pattern is abuttingly fastened to the boss.

4. The electronic control unit of claim 1, further comprising:
an electrically-insulating protective coat covering a portion of the first circuit pattern that is not in contact with the first heat conductor.

5. The electronic control unit of claim 1, further comprising:
an electrically-insulating protective coat covering a portion of the second circuit pattern that is not in contact with a third heat conductor.

6. The electronic control unit of claim 1, further comprising:
at least one of a diode, an IC, a coil, or a capacitor connected to the first circuit pattern or the second circuit pattern.

7. The electronic control unit of claim 1, further comprising:
a first airgap disposed between the base portion and the resin body; and
a second airgap disposed between the first shaped portion and the resin body.

8. The electronic control unit of claim 1, wherein the radiator further comprises a first side facing the substrate and the semiconductor chip, and a second side facing a rotor of a rotating electric machine.

9. The electronic control unit of claim 1, wherein the substrate comprises a first side where the semiconductor chip is mounted, and a second side opposite the first side, the second side allowing for mounting of an electronic component other than the semiconductor chip.

10. A rotating electric machine comprising:
a motor case having a cylindrical shape;
an end cap positioned at an axial end of the motor case;
a stator housed in the motor case;
a rotor rotatably disposed inside of the stator;
a shaft disposed at a center of the rotor;
a winding wound on the stator;
an electronic control unit positioned at the axial end of the motor case and controlling a supply of electric power to the winding, the electronic control unit having a substrate, a first circuit pattern and a second circuit pattern disposed on the substrate, a semiconductor chip electrically connected to the first circuit pattern and the second circuit pattern;
a resin body wrapped around a portion of the semiconductor chip and having a board shape with a first face facing the substrate and a second face facing away from the substrate;
a first metal plate having a side connected to the semiconductor chip and having an other side connected to the first circuit pattern;
a radiator having a base portion and a first shaped portion, the base portion having a board shape with a predetermined thickness, the base portion disposed on an opposite side of the resin body relative to the substrate, the first shaped portion projecting from the base portion toward the first circuit pattern and forming a first gap that is defined between the first shaped portion and the first circuit pattern;
a first heat conductor disposed in the first gap and transmitting heat from first circuit pattern to the radiator;
a second metal plate disposed on an opposite side of the semiconductor chip relative to the first metal plate to sandwich the semiconductor chip between the first metal plate and the second metal plate, the second metal plate having a side connected to the semiconductor chip and an other side facing away from the second face of the resin body;
a second shaped portion of the radiator projecting from the base portion toward the second metal plate to form a second gap that is defined between the second shaped portion and the second metal plate; and
a second heat conductor disposed in the second gap to transmit heat of the second metal plate to the radiator, wherein
the radiator is formed either (i) as a single body with the end cap, (ii) separate from and in direct contact with the end cap, or (iii) separate from and in thermal connection with the end cap,
the radiator further comprises a boss and a support projecting from the base portion of the radiator as one body, the boss and the support abutting at least one of the substrate, the first circuit pattern and the second circuit pattern, and
the second shaped portion has a surface that faces the resin body, the surface has an area that is equal to or greater than an area of the second face of the resin body, and the second shaped portion is unitary with and projects directly from the base portion toward the second metal plate.

* * * * *